United States Patent
Luberek

(10) Patent No.: US 7,759,620 B2
(45) Date of Patent: Jul. 20, 2010

(54) FOURIER PLANE ANALYSIS AND REFINEMENT OF SLM CALIBRATION

(75) Inventor: Jarek Luberek, Mölndal (SE)

(73) Assignee: Micronic Laser Systems AB, Taby (SE)

( * ) Notice: Subject to any disclaimer, the term of this patent is extended or adjusted under 35 U.S.C. 154(b) by 103 days.

(21) Appl. No.: 11/773,360

(22) Filed: Jul. 3, 2007

(65) Prior Publication Data

US 2009/0008580 A1    Jan. 8, 2009

(51) Int. Cl.
*G01J 1/20* (2006.01)
(52) U.S. Cl. .................................. 250/201.1; 359/238
(58) Field of Classification Search ............. 250/201.1; 359/238
See application file for complete search history.

(56) References Cited

U.S. PATENT DOCUMENTS

| | | | |
|---|---|---|---|
| 2002/0105629 A1* | 8/2002 | Sandstrom et al. | 355/71 |
| 2002/0154589 A1* | 10/2002 | Tanaka et al. | 369/103 |
| 2004/0047023 A1* | 3/2004 | Sandstrom | 359/238 |
| 2004/0207386 A1* | 10/2004 | Durr | 324/121 R |
| 2005/0168790 A1 | 8/2005 | Latypov et al. | |
| 2005/0219502 A1* | 10/2005 | Sandstrom et al. | 355/77 |
| 2006/0039051 A1* | 2/2006 | Baba et al. | 359/35 |

FOREIGN PATENT DOCUMENTS

WO    WO-03/023494 A1    3/2003

OTHER PUBLICATIONS

International Search Report for Intl. Application No. PCT/EP2008/058186 mailed Sep. 26, 2008.
Durr et al., "Characterization of Spatial Light Modulators for Micro Lithography", Proceedings of SPIE, vol. 4985, 2003, pp. 204-214.
Hahn et al., "Real-time digital holographic beam-shaping system with a genetic feedback tuning loop", Applied Optics, vol. 45, No. 5, Feb. 10, 2006, pp. 915-924.
Luberek et al., "Controlling CD Variations in a Massively Parallel Pattern Generator", Proceedings of SPIE, vol. 4691, 2002, pp. 671-678.

* cited by examiner

*Primary Examiner*—Georgia Y Epps
*Assistant Examiner*—Kevin Wyatt
(74) *Attorney, Agent, or Firm*—Ernest J. Beffel, Jr.; Haynes Beffel & Wolfeld LLP

(57) ABSTRACT

The present disclosure relates to phase-sensitive calibration of an SLM system. In particular, it relates to selecting among local calibrations when there is more than one calibration that satisfies a calibration intensity criteria. It utilizes information available before Fourier filtering, from non-zeroth order diffraction components to counter drift among alternative local calibrations.

5 Claims, 7 Drawing Sheets

FOURIER PLANE ANALYSIS AND REFINEMENT OF SLM CALIBRATION

RELATED APPLICATIONS

This application is related to U.S. patent application Ser. No. 10/238,220, filed on 10 Sep. 2002, entitled "IMPROVED METHOD AND APPARATUS USING AN SLM" by inventors Torbjorn Sandstrom and Jarek Luberek. It also is related to U.S. patent application Ser. No. 09/995,526, filed on 28 Nov. 2001, entitled "DEFECTIVE PIXEL COMPENSATION METHOD" by inventor Torbjorn Sandstrom. It also is related to U.S. patent application Ser. No. 10/410,874, filed on 10 Apr. 2003, entitled "METHODS AND SYSTEMS FOR PROCESS CONTROL OF CORNER FEATURE EMBELLISHMENT" by inventors Torbjorn Sandstrom, Hans Martinsson, Niklas Eriksson and Jonas Hellgren. It also is related to U.S. patent application Ser. No. 10/757,351, filed on 14 Jan. 2004, entitled "METHOD TO DETECT A DEFECTIVE ELEMENT" by inventor Peter Durr. The related applications are incorporated by reference.

BACKGROUND OF THE INVENTION

The present disclosure relates to phase-sensitive calibration of a spatial light modulator ("SLM") system. In particular, it relates to selecting among local calibrations when there is more than one calibration that satisfies a calibration intensity criteria. It utilizes information available before Fourier filtering, from non-zeroth order diffraction components to counter drift among alternative local calibrations.

Micro-lithographic production is useful for integrated circuits, masks, reticles, flat panel displays, micro-mechanical or micro-optical devices and packaging devices, e.g. lead frames and MCMs. Lithographic production may involve an optical system to image a master pattern onto a mask from an SLM controlled by a computer or to image the pattern directly onto a wafer, in both processes forming structures of a device. A suitable workpiece may include a layer sensitive to electromagnetic radiation, for example visible or non-visible light, applied to a quartz reticle or to a silicon wafer.

The computer-controlled SLM may include a one- or two-dimensional array or matrix of reflective movable micro mirrors, a one- or two-dimensional array or matrix of transmissive LCD crystals, or other similar programmable one- or two-dimensional arrays based on gratings effects, interference effects or mechanical elements (e.g., shutters).

In general, these computer controlled SLMs may be used for the formation of images in a variety of ways. SLMs include many modulating elements, in some instances, a million or more elements. Among the many modulating elements, individual elements most probably do not exhibit identical characteristics. For instance, they may have different reflectivity or they may respond differently to equivalent control signals. These variations in the characteristics of the individual elements of a computer controlled SLM have limited the resolution and accuracy available for their use in optical imaging.

An opportunity arises to improve calibration using information from multiple diffraction orders of a calibration pattern. Better, more easily calibrated and controlled, more reliable and accurate systems and methods of patterning workpieces and producing features on devices may result.

SUMMARY OF THE INVENTION

The present disclosure relates to phase-sensitive calibration of an SLM system. In particular, it relates to selecting among local calibrations when there is more than one calibration that satisfies a calibration intensity criteria. It utilizes information available before Fourier filtering, from non-zeroth order diffraction components to counter drift among alternative local calibrations.

DETAILED DESCRIPTION

The following detailed description is made with reference to the figures. Preferred embodiments are described to illustrate the present invention, not to limit its scope, which is defined by the claims. Those of ordinary skill in the art will recognize a variety of equivalent variations on the description that follows.

Figure 1:
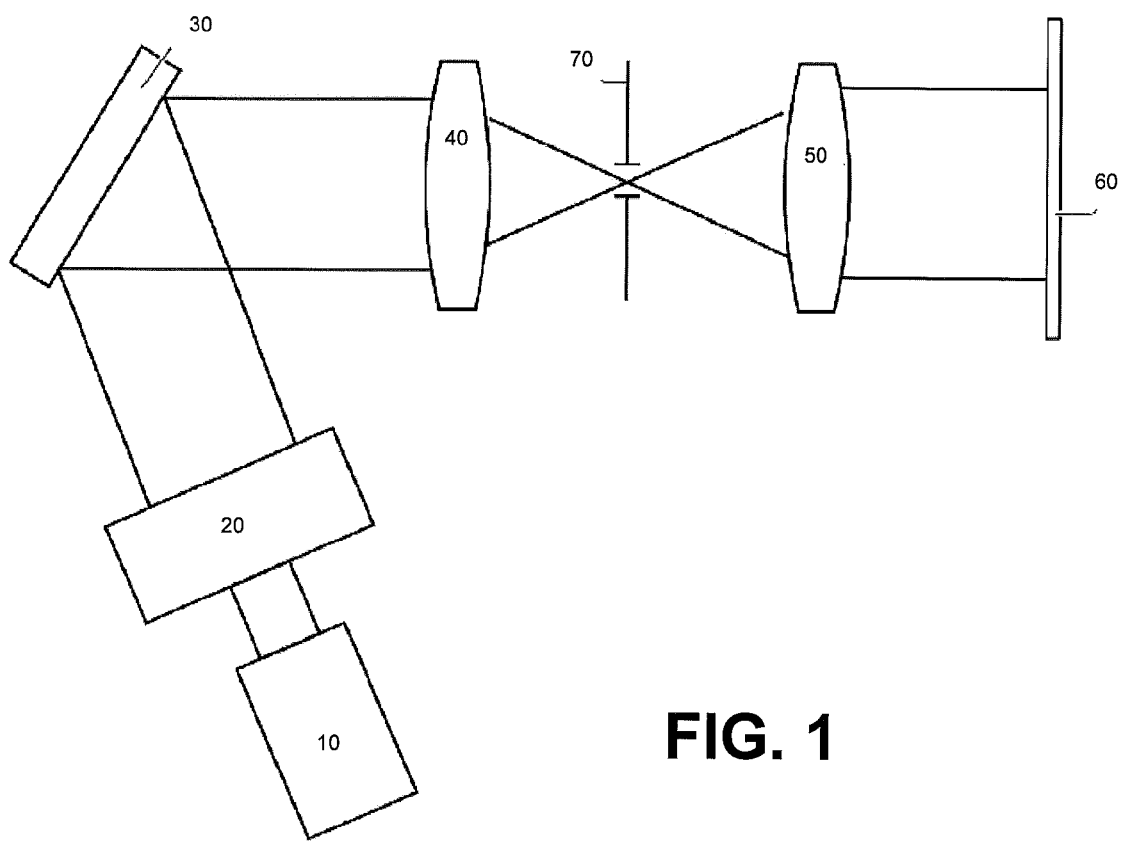
FIG. 1 illustrates an embodiment of an apparatus for forming and image on workpiece.

FIG. 1 illustrates an embodiment of an apparatus 1 for forming an image on a workpiece 60. Prior applications with a common assignee also have used this figure, including the application that became U.S. Pat. No. 6,618,185. The device and method disclosed herein are useful for calibrating such an apparatus. It includes a source 10 for emitting electromagnetic radiation, a beam conditioner arrangement 20, a computer controlled SLM 30, a first lens arrangement 40, a spatial filter 70 suitably located in a Fourier plane, a second lens arrangement 50, a workpiece 60, a beam splitter 90, a third lens arrangement 45 and an arrangement for measuring electromagnetic radiation 65. The function of electromagnetic radiation splitter 90 could be performed by a reflective element. The formation of an SLM image onto workpiece 60 may be performed independently or simultaneously with the formation of an SLM image onto detector arrangement 65.

The source 10 may emit radiation in a pulsed or continuous manner. For a case in which radiation source 10 emits continuous radiation, said radiation may be formed into pulsed radiation by means of a shutter. Said shutter may be located in the radiation path between radiation source 10 and computer controlled SLM 30. Radiation source 10 may be a KrF excimer laser emitting a pulsed output at 248 mu, a pulse duration of approximately 10 ns, and a repetition rate of approximately 1000 to 4000 Hz. The repetition rate of the exemplary radiation source may be below or above 1000 Hz. The source 10 may emit radiation exhibiting single-mode or multi-mode properties. In another embodiment, in which the radiation source 10 emits single-mode radiation, conditioner arrangement 20 may not be necessary.

The conditioner arrangement 20 may include an aperture. The size of said aperture may be changed in order to control the coherence length (i.e., spatial coherence) of the electromagnetic radiation illuminating SLM 30. The spatial filter 70 shown in FIG. 1 may be changed in order to control the resolution of the optical image formed onto workpiece 60 or said arrangement for measuring electromagnetic radiation 65. The conditioner arrangement 20 may comprise a simple lens, an assembly of lenses, other optical components, refractive elements, or reflective elements. The electromagnetic radiation conditioner arrangement 20 distributes the radiation emitted from the radiation source 10 uniformly over at least a part of the surface of the computer controlled SLM 30. In the case of a continuous electromagnetic radiation source, said radiation from said source may be scanned over the surface of the computer controlled SLM. The conditioner arrangement 20 is likely to improve the intensity uniformity of the electromagnetic radiation from source 10 illuminating the surface of the SLM. It may alter the area of the electromagnetic radiation from source 10 illuminating the surface of the SLM. It may control the spatial coherence length of the electromagnetic radiation from source 10 illuminating the surface of the SLM. In FIG. 1, said electromagnetic radiation measurement arrangement 65 may comprise a Charged Coupled Device (CCD) camera, a MOS-camera, or a Charged Injection Device (CID).

Past applications with a common assignee have described strategies to calibrate the many elements of an SLM. With testing and analysis, it has been observed that gray scale calibration using a checkerboard or chess board pattern has more than one solution. This is a difficult observation to make, because the resulting calibration drift can be less than the detection limits of intensity measurement arrangements 65. Part of this disclosure is describing for the first time an elusive error source, before describing solutions.

Looking again at FIG. 1, when electromagnetic radiation is filtered in the Fourier plane of the optics system, the complex waveforms that it contains are converted to electromagnetic radiation intensity. Complex amplitude data that could be used to track iterative adjustment of mirrors is lost in the Fourier filtering. Accordingly, we disclose how to collect and use information that can be isolated in the Fourier plane, thereby enabling the system to select among alternative calibration solutions.

Fundamentally, iterative solutions to differential equations are only stable if the solution is unique. Applied here, iterative solution to a uniform image during checkerboard calibration (e.g., a uniform gray scale calibration) is stable only if there is only one mirror tilt pattern that gives a uniform image. This introduces a subtle error source that typically falls below detection thresholds and does not generate a systematic fingerprint. With more than one possible solution, the final state of mirror angles after iterative solution can favor one superposition of the patterns that represent possible solutions in one local area of the SLM and gradually develop or drift into another superposition of different solution patterns elsewhere. Drift from one possible solution in one local area to another possible solution in another area may create a subtle pattern with a lower spatial frequency and larger period than the checkerboard calibration. The existence of a low frequency pattern on top of the desired solution creates new diffraction orders close to the border of the Fourier aperture which, in addition, will change as we move around in the object plane of the SLM from which radiation is relayed. Hence, the difference among diffraction orders that can be isolated in the Fourier plane will vary when viewed in the image plane of a detector.

A line pattern loaded onto the SLM will modulate all diffraction orders of the array. If the calibration of the SLM for a checkerboard pattern resulted in the same mirror orientations across the entire SLM array, the projected diffraction orders would be the same for light scattered from all parts of the SLM array. That is, the diffraction orders projected would be stationary with respect to the object plane of the SLM array. When the diffraction orders projected are stationary across the object plane of the SLM array, then modulating the SLM by loading a line pattern would only contribute to an asymmetry of diffraction orders that can be observed and/or isolated in the Fourier plane (see FIGS. 7-8), which might add a constant bias in the resolved image, but would not otherwise degrade CD uniformity. When the diffraction orders after calibration are not stationary and vary across the field of the SLM, the resulting asymmetry is local. It varies as one moves along the length of a line being rendered across the field of calibration. This variance across the length of the line results in an increased CD variation which is rather long-range in nature compared to the resolution.

Figure 2:
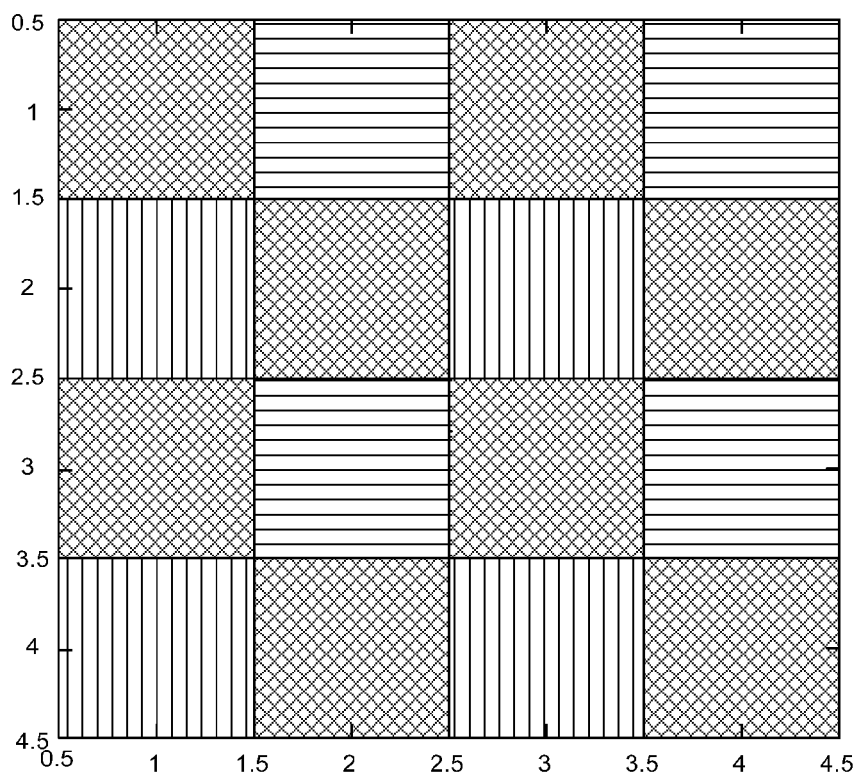
FIG. 2 depicts a chess board calibration that mixes two alternate solutions, thereby producing an unintended low frequency pattern.

During checkerboard calibration there are two patterns that can print a uniform image, one being the checkerboard pattern. The other involves three mirror states: in FIG. 2, hashed squares represent "white" mirrors; vertical and horizontal striped squares represent mirrors being calibrated, which assume opposite angles of deflection with respect to horizontal. For instance, the vertically striped mirrors may be tilted down and the horizontally striped mirrors tilted up. This pattern can change "sign" if we swap vertically and horizontally striped mirrors. The reason for this sign change is the underlying structure of the SLM. Along a row, neighboring SLM mirrors turn in opposite directions. In this pattern, all vertically striped mirrors turn in the same direction and likewise, all horizontally striped mirrors turn in the same but opposite direction relative to the vertically striped ones. This results in redistribution of intensities in the Fourier plane depending on the "sign" of this pattern. If we represent this pattern with as a matrix (here limited to a 4×4 matrix), $$P = \begin{bmatrix} 0 & 1 & 0 & 1 \\ -1 & 0 & -1 & 0 \\ 0 & 1 & 0 & 1 \\ -1 & 0 & -1 & 0 \end{bmatrix} \quad (1)$$

we can use P to represent the distribution of angles over the SLM array. Hence, if $C=|P|$ is a checkerboard pattern, then both C and $C+\alpha P$ are solutions that give uniform images during checkerboard calibration. When calibration drifts across the checkerboard field between the alternative solutions, $\alpha$ can be a slowly varying function with respect to mirror index (position). This is shown in the numerical examples that follow.

NUMERICAL EXAMPLES

These numerical examples show how a slowly varying $\alpha_{i,j}$ can be invisible during checkerboard calibration but create a line width deviation of significant size. The example here will be calibrated manually but the principle of it should still be clear. The SLM model is such that 20 (V) is approximately black and 10 (V) is used as white. The increment 0.1 (V)

represents the smallest change that can be made when an 8 bit word length is used by the calibration program.

First we define a local Gaussian disturbance using the symbol $\epsilon$, so that we can continue to use the symbol $\alpha$ in the general from of the equation $C+\alpha P$ without confusion.

$$\epsilon = \exp(-(i^2+j^2)/10^2) \quad (2)$$

Figure 3:
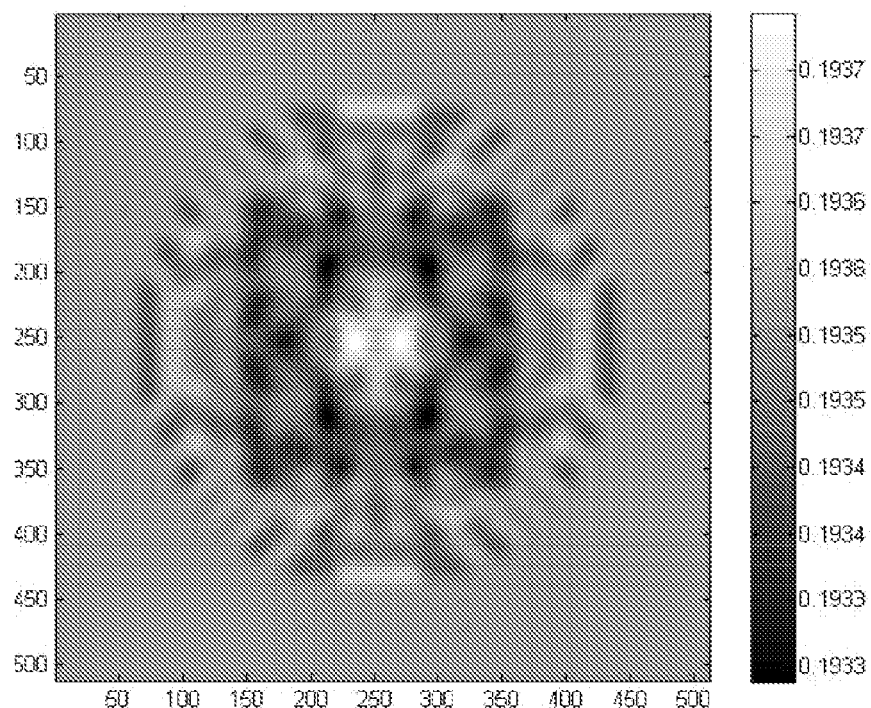
FIG. 3 depicts a Gaussian disturbance combined with a slowly varying pattern in a checkerboard calibration.

A slowly varying pattern across a drifting checkerboard calibration, which is impacted by the disturbance, can be expressed by $$V=10(1-C)+(20+0.017\epsilon)C+0.5\epsilon P \quad (3)$$

and is shown FIG. 3.

Strictly speaking, this is not a calibrated pattern, because the gray values vary across the field (they are not uniform). Effectively though, it will be detected as uniform gray because the variation or lack of uniformity across the field is well below typical detection limits and may be masked by image variation due to SLM mirror height variation and other phase effects. The image in FIG. 3 caries no information about the underlying Gaussian disturbance, as the alternative solutions produce a low spatial frequency variation across the field.

Figure 4:
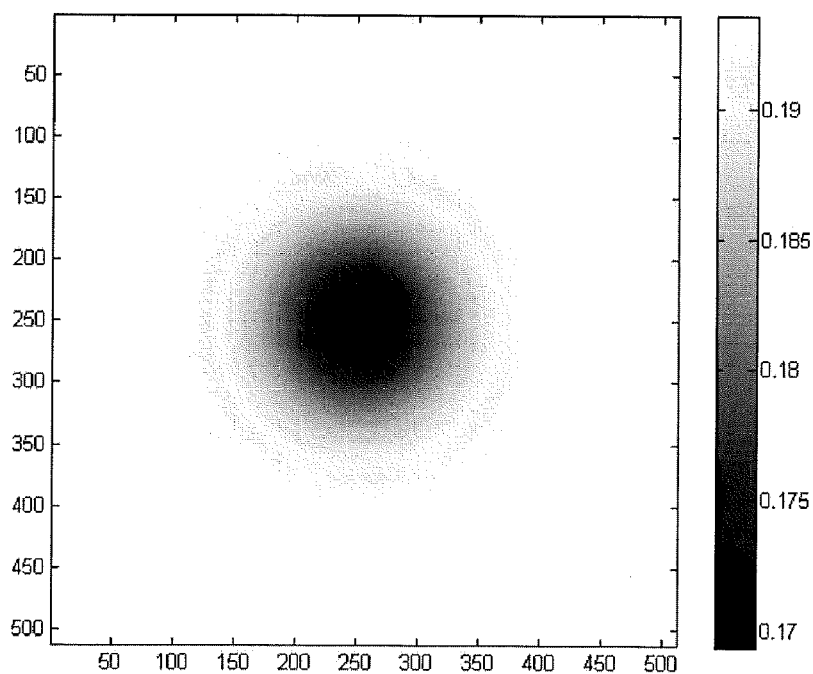
FIG. 4 depicts the Gaussian disturbance by itself.

For comparison, we also present the image response of this local Gaussian disturbance against a single matrix uniform gray solution. When the drift in the calibration pattern is eliminated, so that $\alpha=0$ in the general form $C+\alpha P$, the disturbance across a stable checkerboard calibration is represented by $V=10(1-C)+(20+0.5\epsilon)C$ and is shown in FIG. 4. The Gaussian distribution of the disturbance is readily recognizable in FIG. 4.

The maximum error in the first image (FIG. 3) is less than one tenth of a typical uniform gray calibration detection limit, while the errors in the second image (FIG. 4) are almost 5 times larger the detection limit of about 0.5%. Again, the second image clearly reveals the Gaussian shape of the disturbance.

Figure 5:
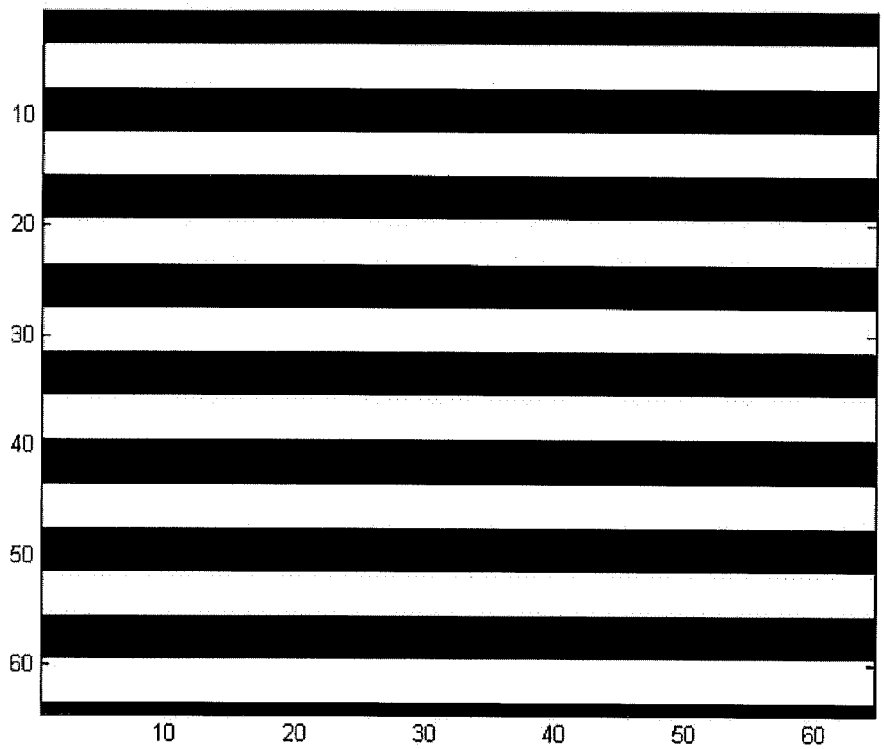
FIG. 5 illustrates a line pattern of interest to microlithography and production of devices on substrates.
Figure 6:
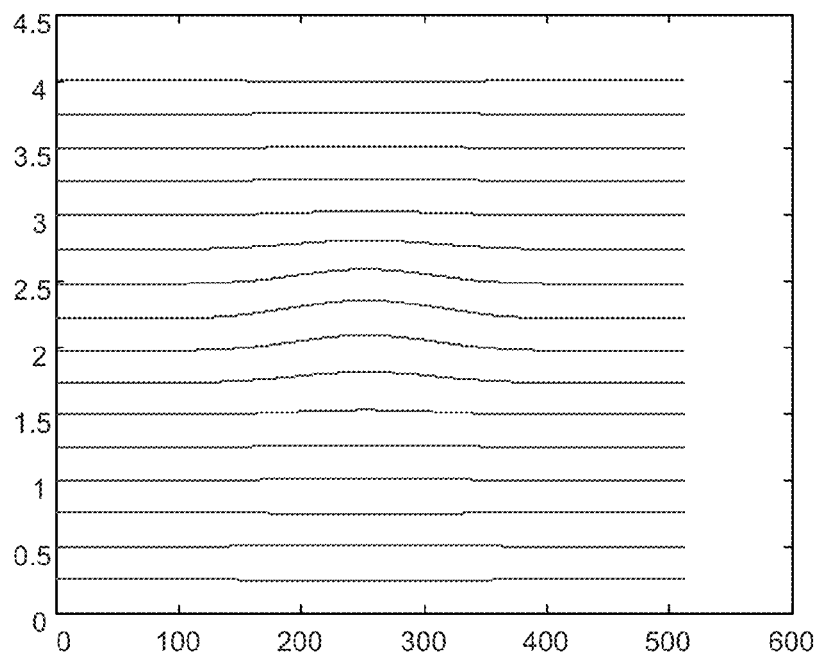
FIG. 6 depicts simulated CD error in printing a line pattern that is caused by a disturbance.

When considering lithographic patterns, in particular, a line-grid pattern such as is shown in FIG. 5 is of interest. When this pattern is printed with the disturbance of $V=0.017\epsilon C+0.5\epsilon P$ on top of the line pattern, the contours of the aerial image that results from this pattern produce a significant bias, as depicted in FIG. 6. In this example, CD is affected less since the extension of $\epsilon$ is larger than the line width and the line width happens to correspond to an even number of mirrors on the SLM. Had we used odd number of mirrors per line, the line deviations would alternate between adjacent edges and CD variations would double.

Optical Stabilization of Checkerboard Calibration

Figure 7:
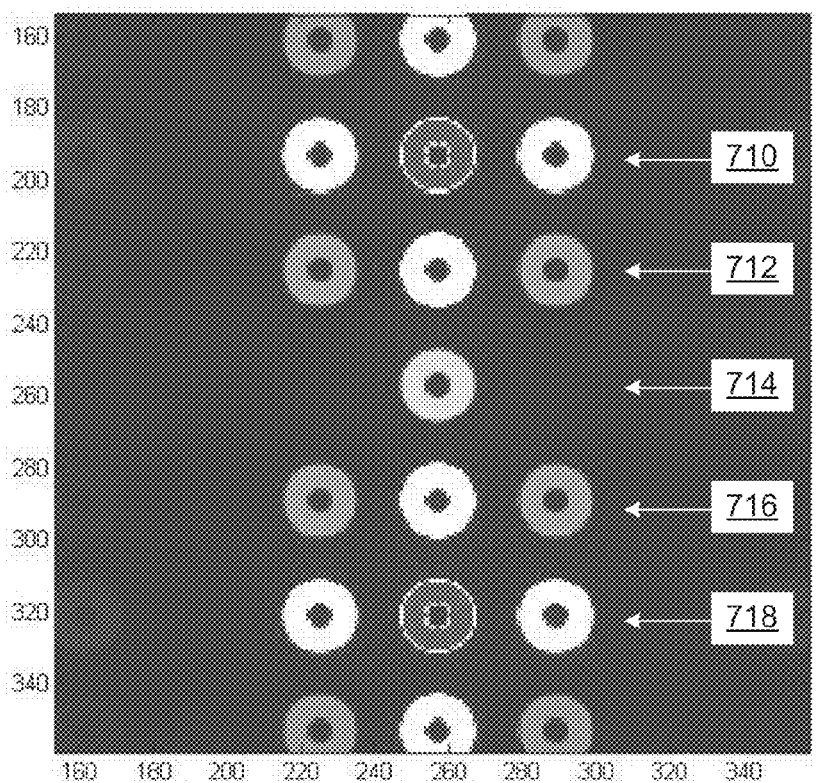
FIG. 7 simulates an image of multiple diffraction orders produced by a pure checkerboard pattern, free of drift between alternate solutions.
Figure 8:
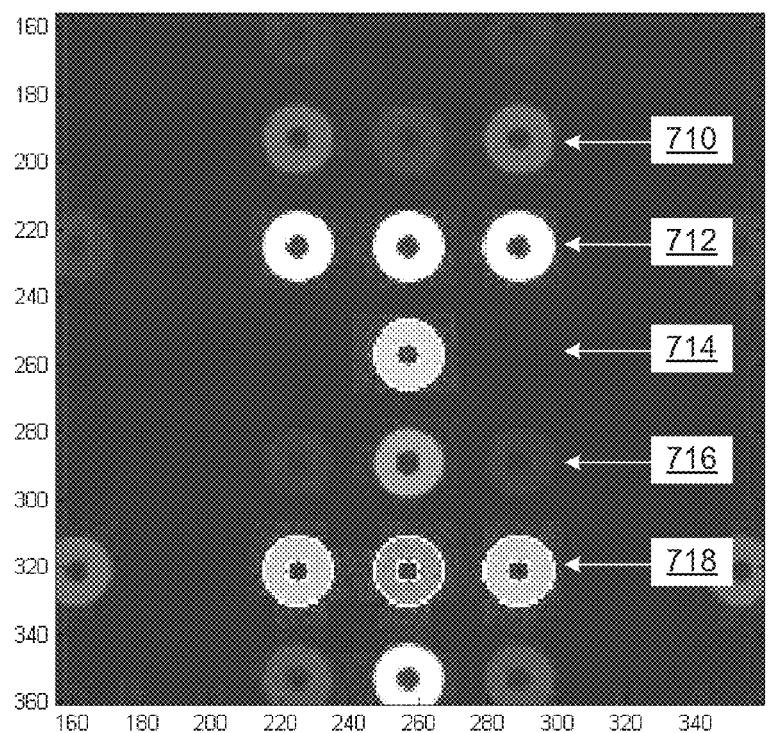
FIG. 8 simulates an image of multiple diffraction orders produced by a checkerboard pattern affected by drift between alternate solutions.
Figure 9:
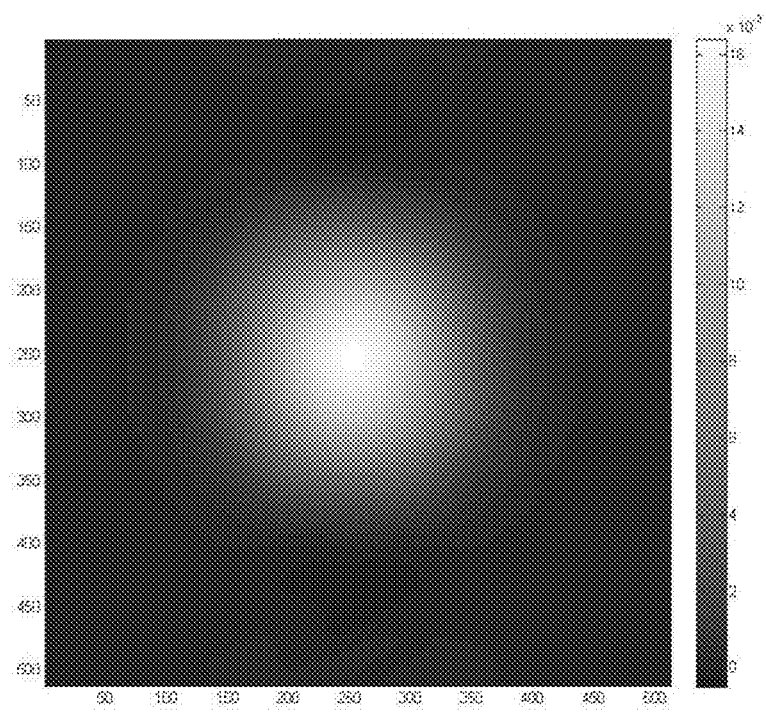
FIG. 9 depicts an error determined by analysis of an image of multiple diffraction orders.

For some SLMs, this instability or drift that we are discussing can be optically detected and corrected. The Fourier transform of a dense checkerboard pattern, not resolvable by this optical system and not subject to drift, is shown in FIG. 7. This Fourier transform is optically observable (and isolatable) in the Fourier plane. Note that the diffraction orders above and below the center (zeroth diffraction order) have equal intensity (color). When we add a pattern including the alternative solution P to the checkerboard pattern C, the Fourier transform appears as shown in FIG. 8. In FIG. 8, the asymmetry of the diffraction orders along the Y-axis can be measured and used to stabilize the checkerboard calibration optically. The diffraction orders are referred to (top to bottom) as +1 (710), +½ (712), +0 (714), -½ (716) and -1 (718). For the pattern $V=20|P|+0.5\epsilon P$ the difference between aerial images obtained by comparing the orders +½ (712) and -½ (716) is depicted in FIG. 9.

Each element in the matrix V drives one individual mirror in the array. Strictly speaking, one could imagine a linear response in the sense that the mirrors whose surface normals, $\alpha$, are tilted according to $\alpha=kV+m$ (k and m being just arbitrary constants) or (perhaps more realistically) quadraticly as $\alpha=kV^2+m$ (the $V^2$ computed element by element in this case.) In this example, however, each element of V is used in an equation where the electrostatic force which is the result of both the specific applied voltage as well as the distance over which this voltage is applied is balanced to the counter force (modeled by Hooks law) which is the result of the torsion of the hinge caused by the applied voltage that causes the mirror to tilt (or rotate through the center of the hinge).

Once the individual mirror tilts are computed we have obtained a structured surface, the height of which is used to compute a phase and through Kirchoff theory a Fourier plane (or far) field is computed. In the Fourier plane one diffraction order is selected and again propagated by another Fourier transform (or again to the far field) to obtain a real image.

This difference pattern happens to be a low-pass filtered image of the Gaussian disturbance $\epsilon$ from equation [2]. If we instead assume a pattern where the "white" mirrors have non-zero voltages, represented by $$V=10(1-|P|)+20|P|+0.5P \quad (4)$$

the signal above is reduced by a factor of 4 (approximately). The problem introduced by this change is that in the presence of non-uniformities; the signal to noise ratio between the diffraction orders +½ and -½ may become too low. To overcome loss of signal to noise ratio, we can compare the orders at +1 and -1 along the Y-axis. Both pairs of diffraction orders have vanishing signal-to-noise ratios for some checkerboard solutions, though not at the same time. Combined, the signal-to-noise ratio of the diffraction orders +½ vs. -½ and +1 vs. -1 can reveal drifting solutions over a wider range of checkerboard gray levels.

While much of this description focuses on checkerboard patterns, other patterns can be loaded into the SLM which are not resolved in the image plane. For instance, closely spaced lines or a uniform gray should appear to the detector in the image plane as a uniform grey image.

Overview of a Method Embodiment

In this section, we present a modification to the uniform gray calibration that inserts a correction step into the calibration loop, based on complex amplitude data collected by selection of diffraction orders in the Fourier plane. The calibration method iterates for checkerboard calibration includes the following steps and substeps.

(1) Pick one reference level. Optionally, that may be the highest calibrated uniform gray level.

(2) Then, for one or two of the checkerboard patterns (C and (1-C)), change the driving voltage according to $v_{i+1}=v_i+(I-g_c) C$ or $v_{i+1}=v_i+(I-g_c) (1-C)$ depending on which checkerboard pattern that is being calibrated. The $g_c$ parametrizes the continuum of checkerboard levels to be calibrated between the reference level and the lowest black level (optionally including negative black.) When the (normalized) image intensity reaches $g_c$, the voltages no longer change and the algorithm stops.

Stabilization and protection against drift are provided by adding to this iterative process the following:

(2A) Create a first image, $I_{1/2}$ by selecting the first (y=½)-order and a second image, $I_{-1/2}$ by selecting (y=-½)-order. Alternative mechanisms for selecting the various diffraction orders are described in the following device embodiments section of this disclosure. Other orders, e.g., plus and minus first diffraction orders (y=+/−1) can produce a better signal to noise ratio in some instances. More than one pair of diffraction orders can be utilized.

(2B) The stabilization of the iteration is provided by inserting into the loop the steps, $v_{i+1}=(I_{1/2}-I_{1/2})P$ and $v_{i+1}=(I_{1/2}-I_{1/2})P'$ during the calibration of (1–C), where P' is the conjugate pattern to P, namely $$P' = \begin{bmatrix} 1 & 0 & 1 & 0 \\ 0 & -1 & 0 & -1 \\ 1 & 0 & 1 & 1 \\ 0 & -1 & 0 & -1 \end{bmatrix}$$

While a four by four conjugate pattern is identified above, it will be recognized that other patterns and conjugate patterns can be constructed in larger and/or smaller matrixes and non-square matrixes.

The specific application would also keep track of the difference in how the checkerboard level changes with voltage for different mirrors. The variable $v_i$ may be thought of as a matrix where each element corresponds to one mirror.

Device Embodiments

The calibration apparatus should to be able to capture aerial images from at least 3 and up to 5 different diffraction orders. Three alternative mechanisms that use a single detector are illustrated. Of course, with calibration among detectors, an array of properly spaced detectors might be used, rather than steering different diffraction orders to the same detector.

Figure 10:
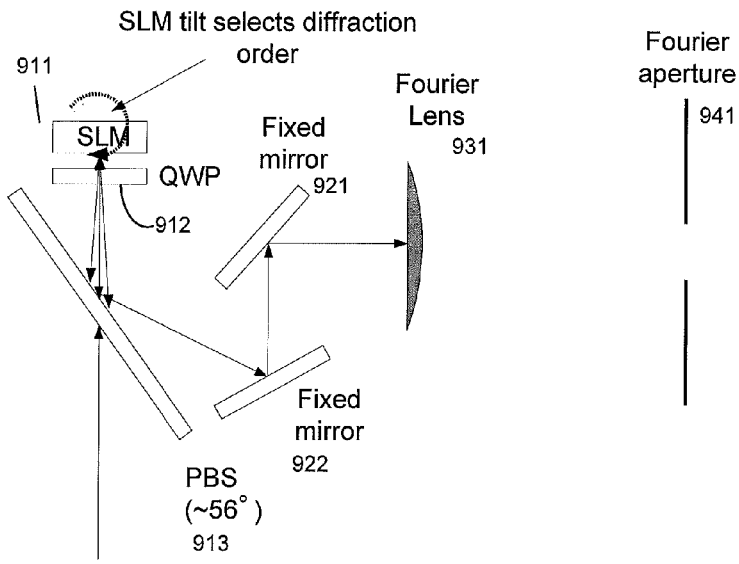
FIGS. 10-12 depict alternative device configurations for collecting an image of multiple diffraction orders.

FIG. 10 depicts the rotation of the SLM 911 and while the rest of the optical path is kept steady: the quarter wave plate (QWP) 912, the polarized beam splitter 913, the fixed mirrors 921 and 922, the Fourier lens 931 and the Fourier aperture 941. By rotating the SLM slightly, the various diffraction orders can be projected through the center of the optical path onto a detector (not shown.)

Figure 11:
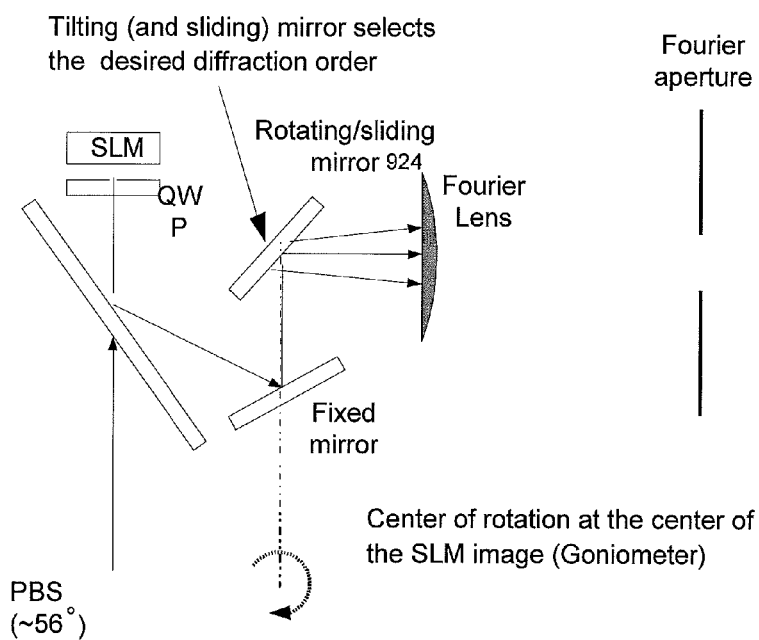

FIG. 11 depicts use of a rotating and/or sliding mirror 924, with other elements steady. The mirror can be rotated so that its center of rotation matches the center of the calibration area in the SLM object plane. Sliding the mirror can simplify how the center of rotation is implemented. The combination of rotating and/or sliding should keep the desired section of the calibration area in the eye of the imager, as different diffraction orders are sampled.

Figure 12:
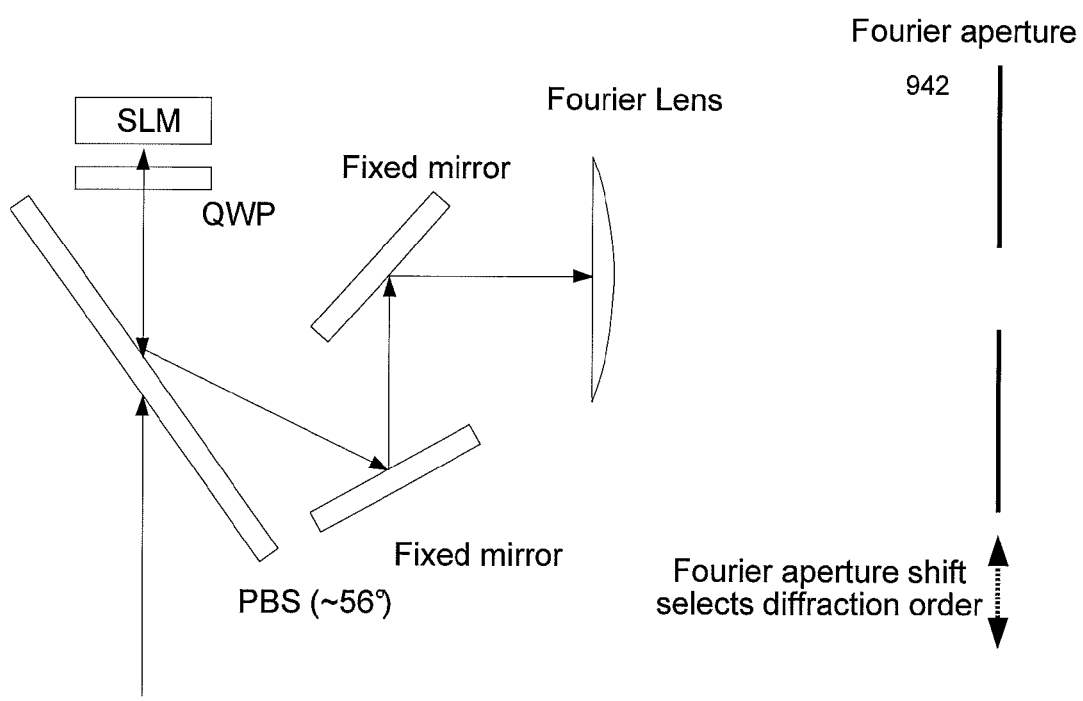

FIG. 12 depicts use of a sliding Fourier aperture 942 and detector. Using a steady optical path, the diffraction orders are physically separated at the Fourier plane. The aperture can be shifted along an axis in the Fourier to select different diffraction orders. Some distortion of the resulting images can be expected, because of the varying angle between the Fourier lens and the detector, as it is moved to different positions.

Some Particular Embodiments

The technology disclosed may be practiced as a method or device adapted to practice the method. The disclosure can be viewed from the perspective of a calibration controller or a pattern generator having an SLM in need of calibration. The invention may be an article of manufacture such as media impressed with logic to carry out computer-assisted phase-aware calibration.

One embodiment is a method of calibrating a spatial light modulator (SLM) having a multitude of SLM elements for which multiple alternative calibrations produced practically indistinguishable intensity patterns on a detector. This is one of many environments in which the method is useful. By practically indistinguishable, we mean that, for at least some drift between alternative calibrations and some disturbances, an intensity sensor in an image plane cannot recognize the drift or cannot recognize the distrubance, due to the drift.

The method embodiment includes projecting from the SLM a zeroth diffraction order of at least one image of the calibration pattern onto an intensity detector in an image plane and iteratively adjusting groups of the SLM elements to produce a uniform intensity. The method further includes, at least occasionally during the iteratively adjusting elements, collecting and comparing at least two diffraction orders of the image on opposite sides of a zeroth diffraction order, and utilizing differences between the diffraction orders to guide the iteratively adjusting elements.

One aspect of the method embodiment is that the calibration pattern may be a checkerboard or chessboard pattern. The chessboard pattern may be small and closely spaced, such that it is not resolved in the image plane. Not resolved may mean that the chessboard pattern produces a uniform intensity pattern in the image plane. Alternatively, the chessboard pattern may be projected unsharp onto the image plane so that produces a uniform intensity pattern.

The method may further include inverting the chessboard pattern and comparing images of the chessboard pattern and the inverted chessboard pattern during the iterative adjustment of the groups of the SLM elements. It also may further include passing the calibration image through an aperture in a Fourier plane of the projection optics in order to isolate the two diffraction orders that are compared. Four means of isolating the two diffraction orders have been described. One means includes adjusting the orientation of the SLM to direct the two diffraction orders through the aperture in the Fourier plane where the zeroth diffraction order would otherwise pass. A second means includes adjusting orientation and/or positioning of an intermediate reflective device, such as a mirror or beam splitter, in the projection optics in order to direct the diffraction orders through the aperture in the Fourier plane where the zeroth diffraction order of the image would otherwise pass. A third means includes repositioning the aperture in the Fourier plane, whereby the diffraction orders are projected through the aperture where the zeroth diffraction order of the image would otherwise pass. When the aperture is repositioned, the detector behind it also is likely to be repositioned. In this means, the detector will image diffraction orders that are projected along different angles relative to the central, the zeroth order. Compensation may be required for the different angles. The fourth means includes multiple openings in the Fourier aperture, thereby avoiding relocating the aperture during the calibration.

The method and any of its aspects further may include producing a mask using the SLM after calibration, using the mask to produce latent images on a workpiece and processing the latent images to produce features of a semiconductor device, all following conventional process steps that need not be explained in a further detail.

Alternatively, the method and any of its aspects may further include using the SLM after calibration directly to produce latent images on a workpiece and processing the latent images to produce features of a semiconductor device on the workpiece. The latent image processing and feature production, again, follow conventional processing steps that need not be explained in further detail.

A device embodiment may be a calibration subsystem usable with a spatial light modulator, the SLM including a multitude of SLM elements, an SLM controller that drives the SLM elements, projection optics that relay electromagnetic radiation images from the SLM through an aperture in a Fourier plane to a workpiece in an image plane. The calibrations subsystem includes detection means for imaging a zeroth diffraction order of the calibration image in the image plane. Structures implementing the detection means may include a charge coupled device (CCD) camera, a CMOS camera, a charged injection device (CID) or their equivalent.

The device embodiment further includes alternate order detection means for imaging at least two diffraction orders on opposite sides of the zeroth diffraction order. Structures implementing the alternate order detection means for imaging are depicted in FIGS. 10-12. Those figures are understood to include a detector appropriately placed beyond the Fourier aperture.

The device embodiment also includes computing resources coupled to the detection means and the alternate order detection means and to the SLM controller. The computing resources include memory, logic and resources adapted to process data from the detection means and iteratively adjust the SLM elements to calibrate the SLM. They are adapted to compare data from the two diffraction orders on the opposite sides of the zeroth order to guide the iterative adjustment of the SLM element. And, they are adapted to signal the SLM controller to drive groups of the SLM elements and iteratively adjust the SLM elements. The structure of memory, logic and resources may be implemented as software running on a general-purpose processor, logic running on a digital signal processor, a custom or semi-custom processor, such as an ASIC or RISC processor, or logic running in a gate array, such as an FPGA.

One aspect of the device embodiment is that the detection means may comprise a beam splitter in an optical path of the projection optics that directs the least part of the calibration image to a CCD or CMOS array in an image plane remote from the workpiece.

Another aspect is that the alternate order detection means may comprise an adjustable mount for the SLM that adjusts orientation of the SLM to direct the two diffraction orders through the aperture in the Fourier plane where the zeroth diffraction order the image would otherwise pass. The adjustable mount may include piezoelectric actuators.

An alternative aspect is that the alternate order detection means may comprise a steering mirror in an optical path of the projection optics that successively directs the two diffraction orders through the aperture in the Fourier plane where the zeroth diffraction order would otherwise pass.

The alternate order detection means, alternatively, may comprise an aperture relocator that repositions the aperture in the Fourier plane to where the two diffraction orders are scattered. A detector may be relocated when the aperture is relocated or multiple detectors may be provided.

Still alternatively, the alternate order detection means may comprise a plurality of detectors positioned where the two diffraction orders are scattered and a Fourier aperture that selects the two diffraction orders for imaging.

Any of the methods described above or aspects of the methods may be embodied in a device adapted to distinguish among alternative calibrations that differ in phase of radiation transmitted by subsets of SLM elements, the phase difference typically expressed as the imaginary term of a complex amplitude, and use the complex amplitude information to reduce or avoid drift among the alternative calibrations that otherwise would impart variation across the SLM after calibration that would have a low spatial frequency.

Another method embodying the present invention is a method of using differences between diffraction order components on opposing sides of a zeroth order diffraction of radiation processed by an SLM, including collecting at least two non-zeroth order diffraction components on opposing sides of the zeroth diffraction order and using any non-symmetry between the non-zeroth diffraction order components to introduce corrections to an SLM calibration, whereby phase differences between elements of the SLM that have been calibrated to produce a particular calibrated intensity are reduced. The aspects of the methods above may generally be combined with this method.

The methods described immediately above and aspects or embodiments of the methods may be embodied in a controller adapted to use differences between diffraction order components on opposing sides of a zeroth order diffraction of radiation processed by an SLM, including collecting at least two non-zeroth order diffraction components on opposing sides of the zeroth diffraction order and using any non-symmetry between the non-zeroth diffraction order components to introduce corrections to an SLM calibration, whereby phase differences between elements of the SLM that have been calibrated to produce a particular calibrated intensity are reduced.

The present invention also may be characterized from the perspective of the pattern generator, as opposed to the controller. From this perspective, the technology disclosed includes a pattern generator that uses an SLM that needs to be calibrated. The pattern generator includes a controller, as described above, that uses differences between diffraction order components on opposing sides of a zeroth order diffraction of radiation processed by an SLM to reduce phase differences among groups of elements of the SLM that have been calibrated to produce a particular calibrated intensity. Aspects of the preceding methods and devices may be combined with this pattern generator.

One aspect from the pattern generator perspective is that the controller may include means for imaging the diffraction order components on opposing sides of the zeroth order diffraction. These means imaging may include the diffraction isolation structures of FIGS. 10-12 and any of the radiation detector structures described above.

In any of the device embodiments, the controller may be embodied in logic and resources such as a general purpose processor, a special purpose processor, a RISC processor or a digital signal processor that executes instructions, such as a logic array, whether embodied in a programmable gate array (PGA), a field programmable gate array (FPGA) or hardware.

While the present invention is disclosed by reference to the preferred embodiments and examples detailed above, it is understood that these examples are intended in an illustrative rather than in a limiting sense. Computer-assisted processing is implicated in the described embodiments. Accordingly, the present invention may be embodied in methods for phase-aware calibration of an SLM, systems including logic and resources to carry out phase-aware calibration of an SLM, systems that take advantage of computer-assisted phase-aware calibration of an SLM, computer-readable memory media impressed with logic to carry out phase-aware calibration of an SLM, data streams impressed with logic to carry out phase-aware calibration of an SLM, or computer-accessible services that carry out computer-assisted phase-aware calibration of an SLM. It is contemplated that modifications and combinations will readily occur to those skilled in the art, which modifications and combinations will be within the spirit of the invention and the scope of the following claims.

I claim:

1. A method of calibrating an SLM (spatial light modulator) having a multitude of SLM elements for which linear combinations of multiple alternative calibrations produce practically indistinguishable intensity patterns on a detector in an image plane, by using analysis of multiple diffraction orders in image data projected from the SLM, the method including:

projecting from the SLM at least one image of a calibration pattern onto an intensity detector in an image plane and iteratively adjusting groups of the SLM elements to produce a uniform intensity;

at least occasionally during the iteratively adjusting the elements, collecting and comparing images of at least two diffraction orders on opposite sides of the zeroth diffraction order and utilizing differences between the images of the diffraction orders to guide the iteratively adjusting the elements;

adjusting orientation of an intermediate reflective device in the projection optics; to direct the diffraction orders through the aperture in the Fourier plane where the zeroth diffraction order of the image would otherwise pass.

2. The method of claim 1, further including adjusting positioning of an intermediate reflective device in the projection optics to direct the diffraction orders through the aperture in the Fourier plane where the zeroth diffraction order of the image would otherwise pass.

3. A calibration subsystem usable with an SLM (spatial light modulator), the SLM including a multitude of SLM elements, an SLM controller that drives the SLM elements, projection optics that relay electromagnetic radiation images from the SLM through an aperture in a Fourier plane to a workpiece in an image pane, the calibration subsystem including:

detection means for imaging a zeroth diffraction order of a calibration image in the image plane;

alternate order detection means for imaging at least two diffraction orders on opposite sides of the zeroth diffraction order wherein the alternate order detection means comprises an adjustable mount for the SLM that adjusts orientation of the SLM to direct the two diffraction orders through the aperture in the Fourier plane where the zeroth diffraction order of the image would otherwise pass;

computing resources coupled to the detection means and the alternate order detection means and to the SLM controller, the computing resources including memory, logic and resources adapted to process data from the detection means and iteratively adjust the SLM elements to calibrate the SLM;

compare data from the two diffraction orders on the opposite sides of the zeroth order to guide the iterative adjustment of the SLM element; and signal the SLM controller to drive groups of the SLM elements and iteratively adjust the SLM elements.

4. The subsystem of claim 3, wherein the adjustable mount includes piezoelectric actuators that adjust orientation of the SLM.

5. A calibration subsystem usable with an SLM (spatial light modulator), the SLM including a multitude of SLM elements, an SLM controller that drives the SLM elements, projection optics that relay electromagnetic radiation images from the SLM through an aperture in a Fourier plane to a workpiece in an image pane, the calibration subsystem including:

detection means for imaging a zeroth diffraction order of a calibration image in the image plane;

alternate order detection means for imaging at least two diffraction orders on opposite sides of the zeroth diffraction order wherein the alternate order detection means comprises a steering mirror in an optical path of the projection optics that successively directs the two diffraction orders through the aperture in the Fourier plane where the zeroth diffraction order of the image would otherwise pass;

computing resources coupled to the detection means and the alternate order detection means and to the SLM controller, the computing resources including memory, logic and resources adapted to process data from the detection means and iteratively adjust the SLM elements to calibrate the SLM;

compare data from the two diffraction orders on the opposite sides of the zeroth order to guide the iterative adjustment of the SLM element; and signal the SLM controller to drive groups of the SLM elements and iteratively adjust the SLM elements.

* * * * *